(12) United States Patent
Wang et al.

(10) Patent No.: US 11,581,506 B2
(45) Date of Patent: Feb. 14, 2023

(54) DISPLAY PANEL AND DISPLAY APPARATUS INCLUDING MULTI-ADHESIVE SPACER LAYER

(71) Applicant: BOE TECHNOLOGY GROUP CO. LTD., Beijing (CN)

(72) Inventors: Haoran Wang, Beijing (CN); Paoming Tsai, Beijing (CN); Shuang Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 94 days.

(21) Appl. No.: 17/119,629

(22) Filed: Dec. 11, 2020

(65) Prior Publication Data
US 2021/0265590 A1    Aug. 26, 2021

(30) Foreign Application Priority Data

Feb. 25, 2020    (CN) .......................... 202010116544.X

(51) Int. Cl.
*H01L 51/00*    (2006.01)
*H01L 51/52*    (2006.01)
(Continued)

(52) U.S. Cl.
CPC .... *H01L 51/5246* (2013.01); *G02F 1/133305* (2013.01); *G06F 1/1641* (2013.01);
(Continued)

(58) Field of Classification Search
CPC ............ H01L 51/5246; H01L 51/0097; H01L 51/5284; H01L 51/525; H01L 2251/5338;
(Continued)

(56) References Cited

U.S. PATENT DOCUMENTS 9,983,424 B2 *    5/2018    Kim ...................... G06F 1/1652
10,212,811 B1 *    2/2019    Zhang ................. H01L 51/0097
(Continued)

FOREIGN PATENT DOCUMENTS

CN    107305906 A    10/2017
CN    108447886 A    8/2018
(Continued)

OTHER PUBLICATIONS

First Office Action dated May 31, 2021 for application No. CN202010116544.X with English translation attached.

*Primary Examiner* — Ida M Soward
(74) *Attorney, Agent, or Firm* — Nath, Goldberg & Meyer; Joshua B. Goldberg

(57) ABSTRACT

The present disclosure provides a display panel and a display apparatus. The display panel includes a display substrate and a support layer one a side of the display substrate. The support layer has a patterned region. The display substrate further includes a spacer layer between the support layer and the display substrate. The spacer layer includes a first adhesive layer, a second adhesive layer and a base material layer between the first adhesive layer and the second adhesive layer. The first adhesive layer is adhered to the display substrate, and the second adhesive layer is adhered to the support layer.

19 Claims, 2 Drawing Sheets

(51) Int. Cl.
*H01L 27/32* (2006.01)
*G02F 1/133* (2006.01)
*G06F 1/16* (2006.01)
*G09F 9/30* (2006.01)
*G09F 9/33* (2006.01)
*G02F 1/1333* (2006.01)

(52) U.S. Cl.
CPC ... *G06F 1/1652* (2013.01); *G09G 2300/0408* (2013.01); *G09G 2300/0804* (2013.01); *H01L 27/3246* (2013.01); *H01L 51/525* (2013.01); *H01L 51/5284* (2013.01); *H01L 2251/301* (2013.01); *H01L 2251/5338* (2013.01)

(58) Field of Classification Search
CPC ........... H01L 2251/301; H01L 27/3244; H01L 27/3246; H01L 27/3295; H01L 23/562; G02F 1/133305; G02F 2001/133357; G06F 1/1652; G06F 1/1641; G09F 9/33; G09F 9/301; G09G 2300/0408; G09G 2300/0804

See application file for complete search history.

(56) References Cited

U.S. PATENT DOCUMENTS

| | | | |
|---|---|---|---|
| 2003/0213956 | A1 | 11/2003 | Hioki et al. |
| 2015/0255522 | A1 | 9/2015 | Sato et al. |
| 2017/0200915 | A1* | 7/2017 | Lee ..................... G02B 5/3033 |
| 2018/0047938 | A1* | 2/2018 | Kishimoto .......... H01L 51/0097 |
| 2018/0150108 | A1* | 5/2018 | Song ..................... H05K 1/028 |
| 2018/0190936 | A1* | 7/2018 | Lee ..................... B32B 25/20 |
| 2018/0192527 | A1* | 7/2018 | Yun ........................ G06F 1/1652 |
| 2019/0101785 | A1* | 4/2019 | Araki ................. H01L 27/3276 |
| 2020/0022267 | A1* | 1/2020 | Han ......................... B32B 5/18 |
| 2020/0051881 | A1* | 2/2020 | Park ..................... B32B 15/095 |
| 2020/0058899 | A1* | 2/2020 | Bu .................... G02F 1/133308 |
| 2020/0136066 | A1* | 4/2020 | Jin ........................ G06F 3/0445 |
| 2020/0313111 | A1* | 10/2020 | Kim ..................... H05K 7/20954 |
| 2020/0344897 | A1* | 10/2020 | Kim ..................... G06F 1/1652 |

FOREIGN PATENT DOCUMENTS

| | | |
|---|---|---|
| CN | 108898954 A | 11/2018 |
| CN | 208141720 U | 11/2018 |
| CN | 109523921 A | 3/2019 |
| CN | 109903679 A | 6/2019 |
| CN | 110085740 A | 8/2019 |
| CN | 110299473 A | 10/2019 |
| CN | 110649070 A | 1/2020 |
| CN | 110649087 A | 1/2020 |
| CN | 110800090 A | 2/2020 |

* cited by examiner

DISPLAY PANEL AND DISPLAY APPARATUS INCLUDING MULTI-ADHESIVE SPACER LAYER

CROSS-REFERENCE TO RELATED APPLICATIONS

The present application claims the priority of the Chinese Patent Application No. 202010116544.X, filed on Feb. 25, 2020, the content of which is incorporated herein by reference in its entirety.

TECHNICAL FIELD

The disclosure relates to the field of display technology, and particularly relates to a display panel and a display apparatus.

BACKGROUND

Currently, in a foldable display apparatus, a metal support member is usually provided on a backside of a flexible display substrate. The metal support member has high elastic modulus and high hardness and rigidity, and can provide a good overall support and a rigidity supplement for the flexible display substrate.

Through holes are usually formed in the metal support member at a bendable region in order to improve bending resistance of the metal support member and prevent the metal support member with high hardness from breaking and failing due to excessive stress during bending.

SUMMARY

According to one aspect of this disclosure, a display panel is provided. The display panel includes a display substrate and a support layer on a side of the display substrate, the support layer having a patterned region, wherein the display panel further includes: a spacer layer between the support layer and the display substrate; and the spacer layer includes a first adhesive layer, a second adhesive layer and a base material layer between the first adhesive layer and the second adhesive layer, the first adhesive layer is adhered to the display substrate, and the second adhesive layer is adhered to the support layer.

In some embodiments, a material of the base material layer includes any one of an organic material, a metal, and an inorganic material.

In some embodiments, the organic material includes any one of polyimide, polyethylene terephthalate, polyethylene, and polyurethane.

In some embodiments, the base material layer has a thickness in a range from 1 μm to 500 μm.

In some embodiments, the base material layer has a thickness in a range from 10 μm to 100 μm.

In some embodiments, the base material layer includes the organic material, a part of the organic material of the base material layer proximal to the support layer is of a foaming structure, and the foaming structure has a thickness in a range from 50 μm to 300 μm.

In some embodiments, the base material layer includes the organic material, and the organic material of the base material layer as a whole is of a foaming structure, and the foaming structure has a thickness in a range from 50 μm to 500 μm.

In some embodiments, the foaming structure of the organic material proximal to the support layer has porosity in a range from 30% to 95%.

In some embodiments, the foaming structure of the organic material as a whole has porosity in a range from 30% to 95%.

In some embodiments, the display panel further includes a black dye layer on the base material layer.

In some embodiments, the support layer includes a support member and the display substrate includes a bendable region, the support member is provided with through holes which penetrate through the support layer to form the patterned region, the bendable region is at a position corresponding to the patterned region, and an orthographic projection of the bendable region on the display substrate is within an orthographic projection of the patterned region on the display substrate.

In some embodiments, the support layer further includes a filling layer including a filling portion to fill the through holes in the support member.

In some embodiments, the filling layer further includes at least one connection sub-layer between the support member and the second adhesive layer.

In some embodiments, a material of the filling layer includes a polymer material, and a material of the second adhesive layer includes an acrylic material or an epoxy resin.

In some embodiments, the filling portion and the at least one connection sub-layer are formed integrally as a single piece.

In some embodiments, the display substrate further comprises a base at a side proximal to the spacer layer, and a material of the base of the display substrate includes polyimide, and a material of the first adhesive layer includes silicone.

In some embodiments, a surface of the spacer layer proximal to the display substrate is flat, and the spacer layer covers the entire surface of the display substrate.

In some embodiments, the metal includes any one of stainless steel and aluminum, and the inorganic material includes glass.

In some embodiments, the material of the base material layer comprises any one of steel, aluminum, and glass; and a surface of the base material layer is provided with a tungsten layer thereon.

According to another aspect of the present disclosure, a display apparatus is provided. The display apparatus includes the display panel above and a driving circuit for driving the display panel.

BRIEF DESCRIPTION OF THE DRAWINGS

The accompanying drawings are used to provide a further understanding of the disclosure and constitute a part of the specification, and are used to interpret the disclosure together with the following specific embodiments, but do not constitute a limitation to the disclosure. In the drawings.

DETAILED DESCRIPTION

The specific embodiments of the present disclosure will be described in detail below with reference to the accompanying drawings. It should be understood that the specific embodiments described herein are merely used to illustrate and explain the present disclosure, and are not used to limit the present disclosure.

Unless otherwise defined, technical or scientific terms used herein shall have the ordinary meaning as understood by those skilled in the art. The terms "first", "second", and the like, as used in the description and in the claims of the disclosure, do not denote any order, quantity, or importance, but rather are used to distinguish one element from another. The word "comprise", "include", or the like, means that the element or item preceding the word includes the element or item listed after the word and its equivalent, but does not exclude other elements or items. The term "connected", "coupled" or the like is not restricted to a physical or mechanical connection, but may include an electrical connection, whether direct or indirect. "Up", "Down", "Left", "Right" and the like are used only to indicate relative positional relationships, and when the absolute position of the object being described is changed, the relative positional relationship may also be changed accordingly.

In a display panel, a segment difference (i.e. a height difference) may occur at a position where a metal support member is provided with through holes at a bendable region thereof. The segment difference may cause an uneven pattern called "pattern stamps" on a contact surface between a flexible display substrate and the metal support member, resulting in influence on lifetime and display effect of the display panel.

Figure 1:
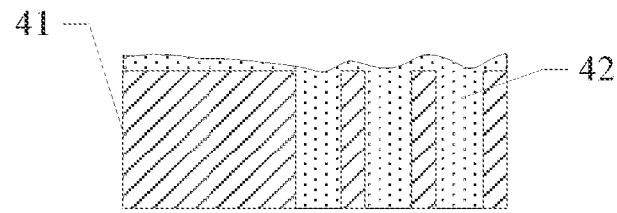
FIG. 1 is a partial schematic view of a support member and a flexible material in through holes thereof in the related art.

Currently, in order to solve the problem of the pattern stamps on the flexible display substrate due to the through holes in the metal support member, a flexible material may be filled in the through holes. FIG. 1 is a partial schematic view of a support member and a flexible material in the through holes of the support member in the related art. As shown in FIG. 1, the through holes of a metal support member 41 is filled with a flexible material 42 to reduce in some extent the segment difference caused by the through holes. However, unevenness inevitably occurs on the surface of the flexible material 42 filled in the metal support member 41. Since the flexible display substrate has low rigidity, after the flexible display substrate is bent, the unevenness on the surface of the flexible material 42 may still causes the pattern stamps on the flexible display substrate, thereby affecting the display effect.

Figure 2:
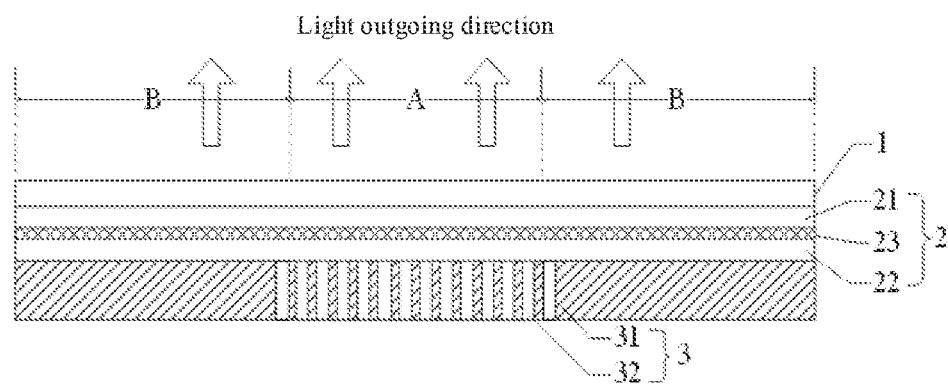
FIG. 2 is a schematic view of a structure of a display panel according to an embodiment of the disclosure.

In view of this, an embodiment of the present disclosure provides a display panel, and FIG. 2 is a schematic view of a structure of a display panel according to an embodiment of the disclosure. As shown in FIG. 2, the display panel provided by the embodiment of the present disclosure includes: a display substrate 1, a support layer 3 and a spacer layer 2. The display substrate 1 includes a display region, which is divided into a bendable region A and non-bendable regions B. The non-bendable regions B are at opposite sides of the bendable region A. The support layer 3 is on a backside (i.e., a non-light-outgoing side) of the display substrate 1, and has a patterned region. The patterned region is corresponding to the bendable region A, and an area of the patterned region is larger than or equal to that of the bendable region, that is, an orthographic projection of the bendable region on the display substrate is within an orthographic projection of the patterned region on the display substrate. The support layer 3 includes a support member 31, and the support layer 3 may further include a filling layer 32. The support member 31 is provided with through holes in a region corresponding to the bendable region, and the region where the through holes are located is the patterned region. At least a part of the filling layer 32 is filled in the through holes, and an elastic modulus of the filling layer 32 is smaller than that of the support member 31. The spacer layer 2 is between the support layer 3 and the display substrate 1, and is coupled to the support layer 3 and the display substrate 1. The spacer layer 2 includes a first adhesive layer 21, a second adhesive layer 22, and a base material layer 23 between the first adhesive layer 21 and the second adhesive layer 22. The first adhesive layer 21 is adhered to the display substrate 1, and the second adhesive layer 22 is adhered to the support layer 3.

Specifically, the display substrate 1 may be an Organic Light Emitting Diode (OLED) display substrate. In this case, the display substrate 1 may include a base and a plurality of pixel units on the base. Each of the plurality of pixel units includes a light emitting device and a pixel driving circuit. The display substrate 1 further includes insulating layers between respective conductive film layers (e.g., a gate insulating layer between a gate and an active layer of a thin film transistor, a planarization layer between a drain of the thin film transistor and an anode of the light emitting device), a pixel defining layer, and the like. The pixel driving circuit includes a plurality of thin film transistors. The light emitting device may be of a bottom-light emitting structure or a top-light emitting structure.

As shown in FIG. 2, the backside of the display substrate 1 is opposite to a light outgoing direction, and the light outgoing direction of the display substrate 1 is a light emitting direction of the light emitting device. In the embodiment of the present disclosure, the display region of the display substrate 1 is divided into a bendable region A and two non-bendable regions B. Specifically, a part of the support layer 3 corresponding to the bendable region A (the patterned region) refers to the part of the support layer 3 directly below the bendable region A in FIG. 2. At least the part of the filling layer 32 filled in the through holes means that the through holes are completely filled with the material of the filling layer 32. A material of the support member 31 may include metal, and the elastic modulus of the support member 31 may be in a range from 10 Gpa to 200 Gpa. The spacer layer 2 may be a layer as one piece to cover an entire lower surface of the display substrate 1, and a surface of the spacer layer 2 facing the display substrate 1 is flat to facilitate adhering to the display substrate 1 by the first adhesive layer.

In the display panel of the embodiment of the disclosure, the segment difference at the through holes may be reduced or eliminated by the filling layer 32, such that a contact surface between the support layer 3 and the spacer layer 2 is relatively flat. Meanwhile, since the spacer layer 2 is between the support layer 3 and the display substrate 1, and the spacer layer 2 includes the base material layer 23, even if the display panel is bent, a force generated by the uneven surface of the support layer 3 can directly act on the spacer layer 2 and is blocked by the base material layer 23, such that the display substrate 1 can be protected by the spacer layer 2, the problem of the pattern stamps on the display substrate 1 is solved, the display effect of the display apparatus is improved, and the lifetime of the display apparatus is prolonged.

A material of the base material layer 23 may include any one of an organic material, a metal, and an inorganic material. The organic material used to form the base material layer 23 may include Polyimide (PI), Polyethylene terephthalate (PET), Polyethylene (PE), and Polyurethane (PU). The metal used to form the base material layer 23 may include stainless steel, aluminum, and the like. The inorganic material used to form the base material layer 23 may include glass.

The base material layer 23 may be made of the above common organic material, and the above organic material may be subjected to a foaming treatment to form a foaming structure (for example, foam). That is, the organic material of the base material layer 23 as a whole is a foaming structure. The foam is soft and has a large elastic modulus, and can buffer a force applied to the display substrate 1.

Figure 4:
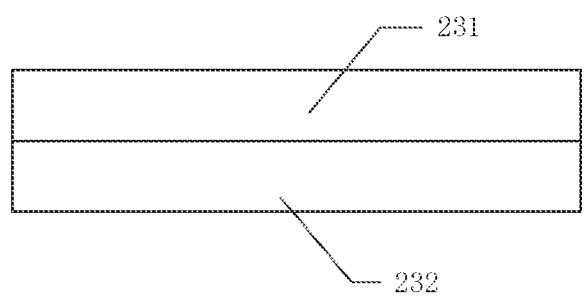
FIG. 4 is a partial schematic view of a base material layer according to an embodiment of the disclosure.

Optionally, as shown in FIG. 4, the base material layer 23 may be formed by combining the above common organic material structure 231 and its foaming structure (foam) 232. Specifically, a part of the organic material proximal to the support layer 3 may be subjected to a foaming treatment, such that the base material layer 23 may include two parts: the common organic material proximal to the display substrate 1 and a foaming-treated organic material proximal to the support layer 3 to buffer the force applied to the display substrate 1. In addition, a foaming structure of any other organic material may alternatively be added on a side of the organic material proximal to the support layer 3, and the present disclosure is not limited thereto.

Optionally, the base material layer 23 is black to facilitate absorption of light irradiating thereon. Specifically, as for the base material layer 23 made of the organic material, a black dye may be coated on the surface of the base material layer 23 to form a black dye layer on the surface of the base material layer 23, and thus the base material layer 23 may present black. As for the base material layer 23 made of the metal or the glass, a layer of tungsten may be formed on the surface of the base material layer 23 by a plating process, and thus the base material layer 23 may present black.

The base material layer 23 may have a thickness (in a direction perpendicular to the display substrate) in a range from 1 μm to 500 μm, thereby improving protection for the display substrate without an excessive thickness. Optionally, the base material layer 23 may have a thickness in a range from 10 μm to 100 μm. Optionally, the spacer layer may include a plurality of base material layers stacked together.

Optionally, in the case where a part of the organic material of the base material layer 23 proximal to the support layer 3 is of a foaming structure, the foaming structure has a thickness in a range from 50 μm to 300 μm. Optionally, in the case where the organic material of the base material layer 23 as a whole is of a foaming structure, the foaming structure may have a thickness in a range from 50 μm to 500 μm.

Optionally, in the case where the organic material of the base material layer 23 is partially or entirely formed as a foaming structure, porosity of the foaming structure may be in a range from 30%~95%. to buffer the force applied to the display substrate 1.

Further, an average surface roughness of the base material layer 23 may be less than or equal to 0.02 mm, and a maximal roughness thereof may be less than or equal to 50% of a entire thickness of the base material layer 23, such that the base material layer 23 is closely adhered to the support layer 3 and the display substrate 1.

It should be noted that, in the embodiments of the present disclosure, the present disclosure is explained by taking one bendable region A and two non-bendable regions B as examples. In practice, the number of the bendable regions A and the number of the non-bendable regions B may be determined according to actual requirements. For example, there may be a plurality of bendable regions A and a plurality of non-bendable regions B. The plurality of bendable regions A and the plurality of non-bendable regions B may be arranged at intervals, such that the display substrate 1 may be folded for multiple times.

Figure 3:
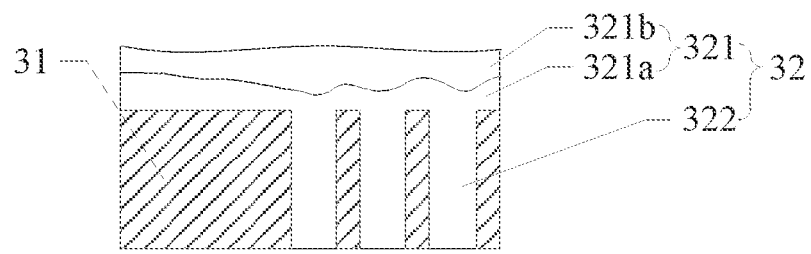
FIG. 3 is a partial schematic view of a support member and a filling layer according to an embodiment of the disclosure.

The structure of the display panel provided by the embodiment of the present disclosure is described in detail in combination with FIG. 2 and FIG. 3. In some specific embodiments, the surface of the spacer layer 2 facing the display substrate 1 may be flat, such that force can be more uniformly applied to the contact surface between the display substrate 1 and the spacer layer 3.

In the embodiment of the present disclosure, an adhesive material of the first adhesive layer 21 may be selected according to a material of the part of the display substrate 1 adhered to the first adhesive layer 21, and an adhesive material of the second adhesive layer 22 may be selected according to a material of the part of the support layer 3 adhered to the second adhesive layer 22, such that the first adhesive layer 21 and the second adhesive layer 22 may be effectively adhered to the display substrate 1 and the support layer 3, respectively, and delamination resistance of the display panel may be improved.

Specifically, the first adhesive layer 21 is adhered to the base of the display substrate 1. In the case where a material of the base of the display substrate 1 includes Polyimide (PI), the material of the corresponding first adhesive layer 21 may include silicone.

In some embodiments, a material of the filling layer 32 may include a polymer material, such as Polyurethane (PU) glue, rubber, silicon, and other curable glues, and the material of the corresponding second adhesive layer 22 may include an acrylic material or an epoxy resin.

FIG. 3 is a partial schematic view of a support member and a filling layer according to an embodiment of the disclosure. As shown in FIG. 2 and FIG. 3, the filling layer 32 includes: filling portions 322, and at least one connection layer 321. The filling portions 322 are filled in the through holes in a one-to-one correspondence, the connection layer 321 is between the support member 31 and the display substrate 1, and the spacer layer 2 is coupled to the connection layer 321.

In the embodiment of the present disclosure, the connection layer 321 may cover the entire surface of the support member 31 proximal to the display substrate 1, such that the force on the part of the support member 31 provided with the through holes may be dispersed throughout the entire support member 31, and the support member 31 may be more uniformly forced, thereby alleviating the stress concentration on the part of the support member 31 provided with the through holes, and improving the product quality. In some embodiments, the filling portions 322 and the connection layer 321 may be formed integrally as a single piece.

In the embodiment of the present disclosure, the connection layer 321 may include a first connection sub-layer 321a and a second connection sub-layer 321b on a side of the first connection sub-layer 321a distal to the filling portions 322. The first and second connection sub-layers 321a and 321b may be formed through two processes. Specifically, a liquid polymer material (e.g., a curable glue) may be printed or coated in the through holes and on a side of the support member 31 proximal to the display substrate 1, and may then be cured to obtain the filling portions 322 and the first connection sub-layer 321a. Then, a liquid polymer material (e.g., a curable glue) may be printed or coated a side of the first connection sub-layer 321a proximal to the display substrate 1, and may then be cured to obtain the second connection sub-layer 321b. An uneven surface of the first connection sub-layer 321a proximal to the display substrate 1 may be filled by the second connection sub-layer 321b, such that the surface of the connection layer 321 proximal to the display substrate 1 is flat, and the adhesion between the filling layer 32 and the spacer layer 2 is increased.

It should be understood that, the materials of the first connection sub-layer 321a and the second connection sub-layer 321b may be the same or different, and in the embodiment of the present disclosure, optionally, the first connection sub-layer 321a and the second connection sub-layer 321b having the same material (for example, a curable glue) are used. In addition, in the embodiment of the present disclosure, the first connection sub-layer 321a and the second connection sub-layer 321b are merely exemplary. In practice, the connection layer 321 may include a plurality of connection sub-layers, and the plurality of connection sub-layers are respectively formed by a plurality of coating processes, so as to further improve the flatness of the connection layer 321.

When the display panel is used, the external environment light may pass through at least a part of the display substrate 1 and irradiate on the spacer layer 2, and if the reflectivity of the spacer layer 2 is high, the external environment light will be reflected to human eyes, thereby affecting the display effect of the display panel. In order to prevent this, in the embodiment of the present disclosure, the base material layer 23 in the spacer layer 2 may include a black film layer with a good light absorption, so as to reduce the reflectivity of the spacer layer 2, and make the reflectivity of the spacer layer 2 less than 30%, thereby improving the display effect of the display panel.

The embodiment of the present disclosure further provides a display apparatus including the display panel in the above embodiment of the present disclosure and a driving circuit for driving the display panel.

The display apparatus may be any product or component with a display function, such as electronic paper, an OLED panel, a mobile phone, a tablet computer, a television, a display, a notebook computer, a digital photo frame, and a navigator.

The display apparatus includes the display panel, and can separate the display substrate from the support layer, such that the display substrate is protected, the problem of pattern stamps on the display substrate is solved, the lifetime of the display apparatus is prolonged, and the display effect is improved.

It should be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A display panel, comprising a display substrate and a support layer on a side of the display substrate, the support layer having a patterned region, wherein
the display panel further comprises a spacer layer between the support layer and the display substrate; and
the spacer layer comprises a first adhesive layer, a second adhesive layer and a base material layer between the first adhesive layer and the second adhesive layer, the first adhesive layer is adhered to the display substrate, and the second adhesive layer is adhered to the support layer,
wherein the display substrate further comprises a base at a side proximal to the spacer layer, and
a material of the base of the display substrate comprises polyimide, and a material of the first adhesive layer comprises silicone.

2. The display panel of claim 1, wherein a material of the base material layer comprises any one of an organic material, a metal, and an inorganic material.

3. The display panel of claim 2, wherein the organic material comprises any one of polyimide, polyethylene terephthalate, polyethylene, and polyurethane.

4. The display panel of claim 3, wherein the base material layer has a thickness in a range from 1 μm to 500 μm.

5. The display panel of claim 4, wherein the base material layer has a thickness in a range from 10 μm to 100 μm.

6. The display panel of claim 4, wherein the base material layer comprises the organic material, a part of the organic material of the base material layer proximal to the support layer is of a foaming structure, and the foaming structure has a thickness in a range from 50 μm to 300 μm.

7. The display panel of claim 4, wherein the base material layer comprises the organic material, and the organic material of the base material layer as a whole is of a foaming structure, and the foaming structure has a thickness in a range from 50 μm to 500 μm.

8. The display panel of claim 6, wherein the foaming structure of the organic material proximal to the support layer has porosity in a range from 30% to 95%.

9. The display panel of claim 7, wherein the foaming structure of the organic material as a whole has porosity in a range from 30% to 95%.

10. The display panel of claim 9, further comprising a black dye layer on the base material layer.

11. The display panel of claim 10, wherein the support layer comprises a support member and the display substrate comprises a bendable region,
the support member is provided with through holes which penetrate through the support layer to form the patterned region, the bendable region is at a position corresponding to the patterned region, and an orthographic projection of the bendable region on the display substrate is within an orthographic projection of the patterned region on the display substrate.

12. The display panel of claim 11, wherein the support layer further comprises a filling layer comprising a filling portion to fill the through holes in the support member.

13. The display panel of claim 12, wherein the filling layer further comprises at least one connection sub-layer between the support member and the second adhesive layer.

14. The display panel of claim 13, wherein a material of the filling layer comprises a polymer material, and a material of the second adhesive layer comprises an acrylic material or an epoxy resin.

15. The display panel of claim 14, wherein the filling portion and the at least one connection sub-layer are formed integrally as a single piece.

16. The display panel of claim 1, wherein a surface of the spacer layer proximal to the display substrate is flat, and the spacer layer covers the entire surface of the display substrate.

17. The display panel of claim 2, wherein the metal comprises any one of stainless steel and aluminum, and the inorganic material comprises glass.

18. The display panel of claim 17, wherein the material of the base material layer comprises any one of steel, aluminum, and glass; and a surface of the base material layer is provided with a tungsten layer thereon.

19. A display apparatus comprising the display panel of claim 1 and a driving circuit for driving the display panel.

\* \* \* \* \*